(12) United States Patent
Yang et al.

(10) Patent No.: US 11,152,403 B2
(45) Date of Patent: Oct. 19, 2021

(54) METHOD FOR MANUFACTURING ARRAY SUBSTRATE, ARRAY SUBSTRATE AND DISPLAY PANEL

(71) Applicants: CHONGQING HKC OPTOELECTRONICS TECHNOLOGY CO., LTD., Chongqing (CN); HKC CORPORATION LIMITED, Shenzhen (CN)

(72) Inventors: Fengyun Yang, Chongqing (CN); En-Tsung Cho, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 453 days.

(21) Appl. No.: 16/311,179

(22) PCT Filed: Oct. 23, 2018

(86) PCT No.: PCT/CN2018/111344
§ 371 (c)(1),
(2) Date: Dec. 19, 2018

(87) PCT Pub. No.: WO2020/047957
PCT Pub. Date: Mar. 12, 2020

(65) Prior Publication Data
US 2021/0225904 A1    Jul. 22, 2021

(30) Foreign Application Priority Data
Sep. 3, 2018 (CN) .......................... 201811021331.8

(51) Int. Cl.
*H01L 27/12* (2006.01)
*H01L 29/786* (2006.01)
*H01L 29/66* (2006.01)

(52) U.S. Cl.
CPC .... *H01L 27/1288* (2013.01); *H01L 29/66742* (2013.01); *H01L 29/78696* (2013.01)

(58) Field of Classification Search
CPC ........... H01L 27/1288; H01L 29/66742; H01L 29/78696
(Continued)

(56) References Cited

U.S. PATENT DOCUMENTS

2010/0289023 A1* 11/2010 Choi ...................... H01L 29/458
257/59
2011/0223700 A1* 9/2011 Deng ................... H01L 27/1288
438/34
(Continued)

FOREIGN PATENT DOCUMENTS

| CN | 102890378 A | 1/2013 |
| CN | 104051472 A | 9/2014 |

(Continued)

OTHER PUBLICATIONS

Fengyuan, Zhao, the ISA written comments, dated Mar. 2019, CN.

*Primary Examiner* — Tong-Ho Kim (57) ABSTRACT

This application provides a method for manufacturing an array substrate, an array substrate, and a display panel. A gate metal layer, a gate insulating layer, and a semiconductor active layer are formed by using one photomask process, a first passivation layer is formed in one photomask process, and a source metal layer, a drain metal layer, and a pixel electrode layer are formed on the first passivation layer.

6 Claims, 6 Drawing Sheets

(58) Field of Classification Search
USPC .......................................................... 257/66
See application file for complete search history.

(56) References Cited

U.S. PATENT DOCUMENTS

| 2012/0188478 A1* | 7/2012 | Kuwabara ......... G02F 1/136286 |
| | | 349/43 |
| 2014/0077207 A1* | 3/2014 | Gao ...................... H01L 27/124 |
| | | 257/43 |
| 2019/0097063 A1* | 3/2019 | Shi .................... H01L 29/78696 |

FOREIGN PATENT DOCUMENTS

| CN | 105448934 A | 3/2016 |
| CN | 105589276 A | 5/2016 |
| CN | 107658267 A | 2/2018 |

* cited by examiner

METHOD FOR MANUFACTURING ARRAY SUBSTRATE, ARRAY SUBSTRATE AND DISPLAY PANEL

This application claims the priority to the Chinese Patent Application No. CN201811021331.8, filed to the National Intellectual Property Administration, PRC on Sep. 3, 2018, and entitled "METHOD FOR MANUFACTURING ARRAY SUBSTRATE, ARRAY SUBSTRATE AND DISPLAY PANEL", which is incorporated herein by reference in its entirety.

TECHNICAL FIELD

This application relates to the field of display panel manufacturing, and more specifically, to a method for manufacturing an array substrate, an array substrate, and a display panel.

BACKGROUND

The description herein provides only background information related to this application, but does not necessarily constitute the existing technology. Thin film transistor-liquid crystal displays (TFT-LCD) use a high-performance thin film process (TFT Device) for display. In an exemplary manufacturing process of an amorphous silicon thin film transistor (A-Si TFT), a back channel protective layer etching (back channel etching, BCE) structure is usually used. Compared with an etching stop (ES) structure, the BCE structure has lower structure costs and a simple manufacturing process. However, because a back channel protective layer (back channel) in a BCE structure has a poor interface status, TFT electric leakage is relatively large.

4-mask technology is a manufacturing process in which a gate insulating layer GIN in a 5-mask is combined with a second metal layer M2 into a mask. As shown in FIG. 4a to FIG. 4e, the second metal layer is used as a protective layer to etch a semiconductor active layer and a gate insulating layer. As a result, the width of the semiconductor active layer is equal to or even greater than the width of the second metal layer M2, that is the width of a source metal layer and a drain metal layer formed together. Consequently, the width of the semiconductor active layer is excessively large or even greater than the area of the gate metal layer, which easily causes a relatively large doped silicon tail (AS tail), and more easily causes a display panel RA image sticking (IS) issue.

SUMMARY

In view of the existing defects, an objective of this application is to provide a method for manufacturing an array substrate, an array substrate, and a display panel, to alleviate a doped silicon tail phenomenon and reduce a residual image impact.

The objective of this application is achieved by using the following solutions:

The method for manufacturing an array substrate is provided, and the method comprises the following steps:
sequentially depositing a first metal base layer, an insulating base layer, and a semiconductor active base layer on a substrate;
performing exposure once above the semiconductor active base layer by using a halftone photomask, and forming a gate metal layer, a gate insulating layer, and a semiconductor active layer above the semiconductor active base layer, wherein the width of the semiconductor active layer is less than the width of the gate metal layer in a direction parallel to the substrate;
depositing a first passivation base layer above the substrate, the gate metal layer, the gate insulating layer, and the semiconductor active layer;
forming a first passivation layer above the first passivation base layer by using a first photomask, wherein via holes exposing the semiconductor active layer are formed at positions on the first passivation layer that correspond to the source metal layer and the drain metal layer; the first passivation base layer between two via holes is a channel protective layer, and the channel protective layer covers a part that is between the two via holes on the semiconductor active layer and that is not blocked by the source metal layer and the drain metal layer;
sequentially depositing a second metal base layer and a second passivation base layer on the first passivation layer;
coating a photoresist material layer on the second passivation base layer, performing patterning treatment on a photoresist material by using the second photomask, etching a pattern of the second passivation layer by using the coated photoresist material layer as a protective layer, etching the second metal base layer by wet etching once by using the formed pattern of the second passivation layer as a protective layer, so that the second metal base layer breaks into the source metal layer and the drain metal layer, and then removing the photoresist material layer, wherein the source metal layer and the drain metal layer are respectively in communication with the semiconductor active layer through the via holes; and a contact hole is formed on the second passivation layer above the corresponding drain metal layer to expose the drain metal layer; and
depositing a transparent electrode substrate on the second passivation layer and forming the pixel electrode layer by using a third photomask, wherein the pixel electrode layer is in conduction to the drain metal layer through the contact hole.

A method for manufacturing an array substrate, the method comprising:
sequentially depositing a first metal base layer, an insulating base layer, and a semiconductor active base layer on a substrate;
forming a gate metal layer, a gate insulating layer, and a semiconductor active layer above the semiconductor active base layer by using one photomask process, wherein the width of the semiconductor active layer is less than the width of the gate metal layer in a direction parallel to the substrate;
forming a first passivation layer above the gate metal layer, the gate insulating layer, and the semiconductor active layer by using one photomask process, and forming a source metal layer and a drain metal layer on the first passivation layer; and
forming a pixel electrode layer in conduction to the drain metal layer.

In the step of forming a gate metal layer, a gate insulating layer, and a semiconductor active layer above the semiconductor active base layer by using one photomask process, exposure is performed once by using a halftone photomask, so that the gate metal layer, the gate insulating layer, and the semiconductor active layer are formed above the semiconductor active base layer, and the width of the semiconductor active layer is less than the width of the gate metal layer in the direction parallel to the substrate.

The step of forming a first passivation layer above the gate metal layer, the gate insulating layer, and the semiconductor active layer by using one photomask process, and forming a source metal layer and a drain metal layer on the first passivation layer further comprises a step of forming a channel protective layer on a part of the semiconductor active layer and that is not blocked by the source metal layer and the drain metal layer. The channel protective layer is formed on the part of the semiconductor active layer and that is not blocked by the source metal layer and the drain metal layer, so that a TFT channel area is fully blocked by the source metal layer, the drain metal layer, and the channel protective layer, so that light in a panel does not radiate the semiconductor active layer in the TFT channel area, thereby reducing generated photocurrents.

The step of forming a first passivation layer above the gate metal layer, the gate insulating layer, and the semiconductor active layer by using one photomask process, and forming a source metal layer and a drain metal layer on the first passivation layer further comprises the following steps:

depositing a first passivation base layer above the substrate, the gate metal layer, the gate insulating layer, and the semiconductor active layer;

forming a first passivation layer above the first passivation base layer by using a first photomask, wherein via holes exposing the semiconductor active layer are formed at positions on the first passivation layer that correspond to the source metal layer and the drain metal layer; the first passivation base layer between two via holes is a channel protective layer, and the channel protective layer covers a part that is between the two via holes on the semiconductor active layer and that is not blocked by the source metal layer and the drain metal layer;

sequentially depositing a second metal base layer and a second passivation base layer on the first passivation layer;

forming the source metal layer, the drain metal layer, and a second passivation layer above the second passivation base layer by using a second photomask, wherein the source metal layer and the drain metal layer are respectively in communication with the semiconductor active layer through the via holes; and a contact hole is formed on the second passivation layer above the corresponding drain metal layer to expose the drain metal layer; and the step of forming a pixel electrode layer in conduction to the drain metal layer comprises: depositing a transparent electrode substrate on the second passivation layer and forming the pixel electrode layer by using a third photomask, wherein the pixel electrode layer is in conduction to the drain metal layer through the contact hole.

The step of forming the source metal layer, the drain metal layer, and a second passivation layer above the second passivation base layer by using a second photomask comprises: coating a photoresist material layer on the second passivation base layer, performing patterning treatment on a photoresist material by using the second photomask, etching a pattern of the second passivation layer by using the coated photoresist material layer as a protective layer, etching the second metal base layer by wet etching once by using the formed pattern of the second passivation layer as a protective layer, so that the second metal base layer breaks into the source metal layer and the drain metal layer, and then removing the photoresist material layer.

An array substrate, comprising:
a substrate;
a gate metal layer, the gate metal layer being disposed on the substrate;
a gate insulating layer, the gate insulating layer being disposed on the gate metal layer;
a semiconductor active layer, the semiconductor active layer being disposed on the gate insulating layer; and
a source metal layer and a drain metal layer, disposed on the semiconductor active layer, wherein
the width of the semiconductor active layer is less than the width of the gate metal layer in a direction parallel to the substrate.

The array substrate comprises:
a first passivation layer, wherein the first passivation layer covers the gate metal layer, the gate insulating layer, and the semiconductor active layer, and two via holes are formed on the first passivation layer above the semiconductor active layer to expose the semiconductor active layer;
the source metal layer covers one side of the first passivation layer, and one end of the source metal layer is disposed in one via and in contact with the semiconductor active layer;
the drain metal layer covers the other side of the first passivation layer, and one end of the drain metal layer is disposed in the other via and in contact with the semiconductor active layer; and
a channel protective layer is disposed between the two via holes; and the channel protective layer covers a part that is between the two via holes on the semiconductor active layer and that is not blocked by the source metal layer and the drain metal layer.

The array substrate comprises:
a second passivation layer, disposed covering the source metal layer and the drain metal layer respectively, wherein a contact hole is formed on the second passivation layer above the corresponding drain metal layer to expose the drain metal layer; and
a pixel electrode layer, disposed covering the second passivation layer above the drain metal layer, wherein the pixel electrode layer is in communication with the drain metal layer through the contact hole.

Preferably, the width of the gate insulating layer is less than the width of the gate metal layer, the width of the semiconductor active layer is less than the width of the gate insulating layer. In this way, the passivation layer fully covers the gate metal layer, the gate insulating layer, and the semiconductor active layer, and because the semiconductor active layer has a relatively small width, the source metal layer and the drain metal layer blocks two ends of the semiconductor active layer.

A display panel comprises an array substrate and a second substrate disposed opposite to the array substrate.

According to the array substrate of the display panel in this application, the gate metal layer, the gate insulating layer, and the semiconductor active layer are formed by using one photomask process, the first passivation layer is formed on the semiconductor active layer by using one photomask process, and the source metal layer and the drain metal layer are formed on the first passivation layer. Therefore, compared with a 4-photomask process, in the 4-mask process, the pattern of the semiconductor active layer is directly formed according to a photomask pattern instead of depending on patterns of other layers, so that a TFT of which the width of the semiconductor active layer is less than the width of the gate metal layer in the direction parallel to the substrate can also be made, the width of the semiconductor active layer is reduced, and a doped silicon tail phenomenon is significantly improved, thereby alleviating a residual image impact and increasing endurance of the panel.

DETAILED DESCRIPTION

The following describes preferred implementations of this application. The preferred implementations are to be implemented by a person of ordinary skilled in the art according to related technologies that are applicable to this field and to be described below in the specification. Therefore, innovations and benefits of this application can be more easily understood.

This application provides a method for manufacturing an array substrate, an array substrate, and a display panel.

Figure 2:
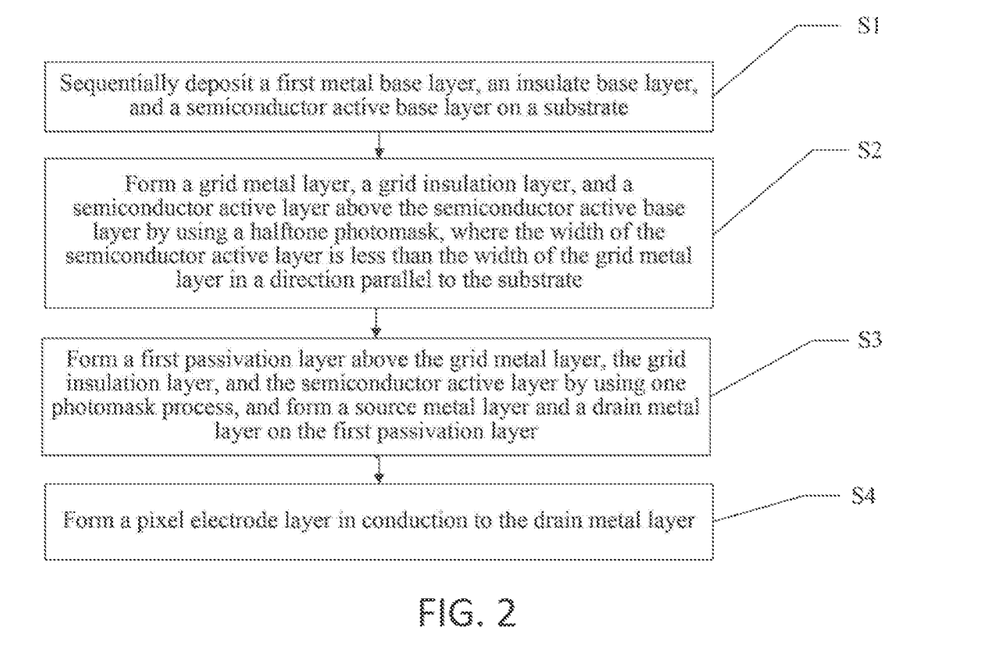
FIG. 2 is a flowchart of a method according to an embodiment of this application.

The objective of this application is achieved by using the following technical solutions:

As shown in FIG. 1a to FIG. 1f, and FIG. 2, this application provides a method for manufacturing an array substrate, including the following steps:

S1: Sequentially deposit a first metal base layer 11, an insulating base layer 12, and a semiconductor active base layer 13 on a substrate 10.

S2: Form a gate metal layer 111, a gate insulating layer 121, and a semiconductor active layer 131 above the semiconductor active base layer 13 by using one photomask process, where the width of the semiconductor active layer 131 is less than the width of the gate metal layer 111 in a direction parallel to the substrate.

S3: Form a first passivation layer 141 above the gate metal layer 111, the gate insulating layer 121, and the semiconductor active layer 131 by using one photomask process, and form a source metal layer 161 and a drain metal layer 162 on the first passivation layer 141.

S4. Form a pixel electrode layer 19 in conduction to the drain metal layer 162.

According to the array substrate of the display panel in this application, the gate metal layer 111, the gate insulating layer 121, and the semiconductor active layer 131 are formed by using one photomask process, the first passivation layer 141 is formed on the semiconductor active layer 131 by using one photomask process, and the source metal layer 161 and the drain metal layer 162 are formed on the first passivation layer 141. Therefore, compared with a 4-photomask process, in the 4-mask process, the pattern of the semiconductor active layer 131 is directly formed according to a photomask pattern instead of depending on patterns of other layers, so that a TFT of which the width of the semiconductor active layer 131 is less than the width of the gate metal layer 111 in the direction parallel to the substrate can also be made, the width of the semiconductor active layer 131 is reduced, and a doped silicon tail phenomenon is significantly improved, thereby alleviating a residual image impact and increasing endurance of the panel.

Figure 1A:
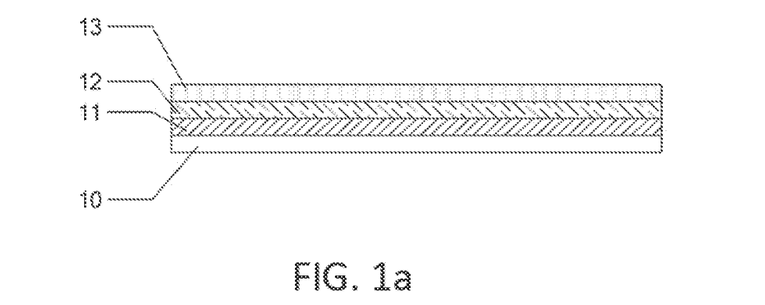
FIG. 1a to FIG. 1f are schematic sectional views of a manufacturing process according to an embodiment of this application.
Figure 3:
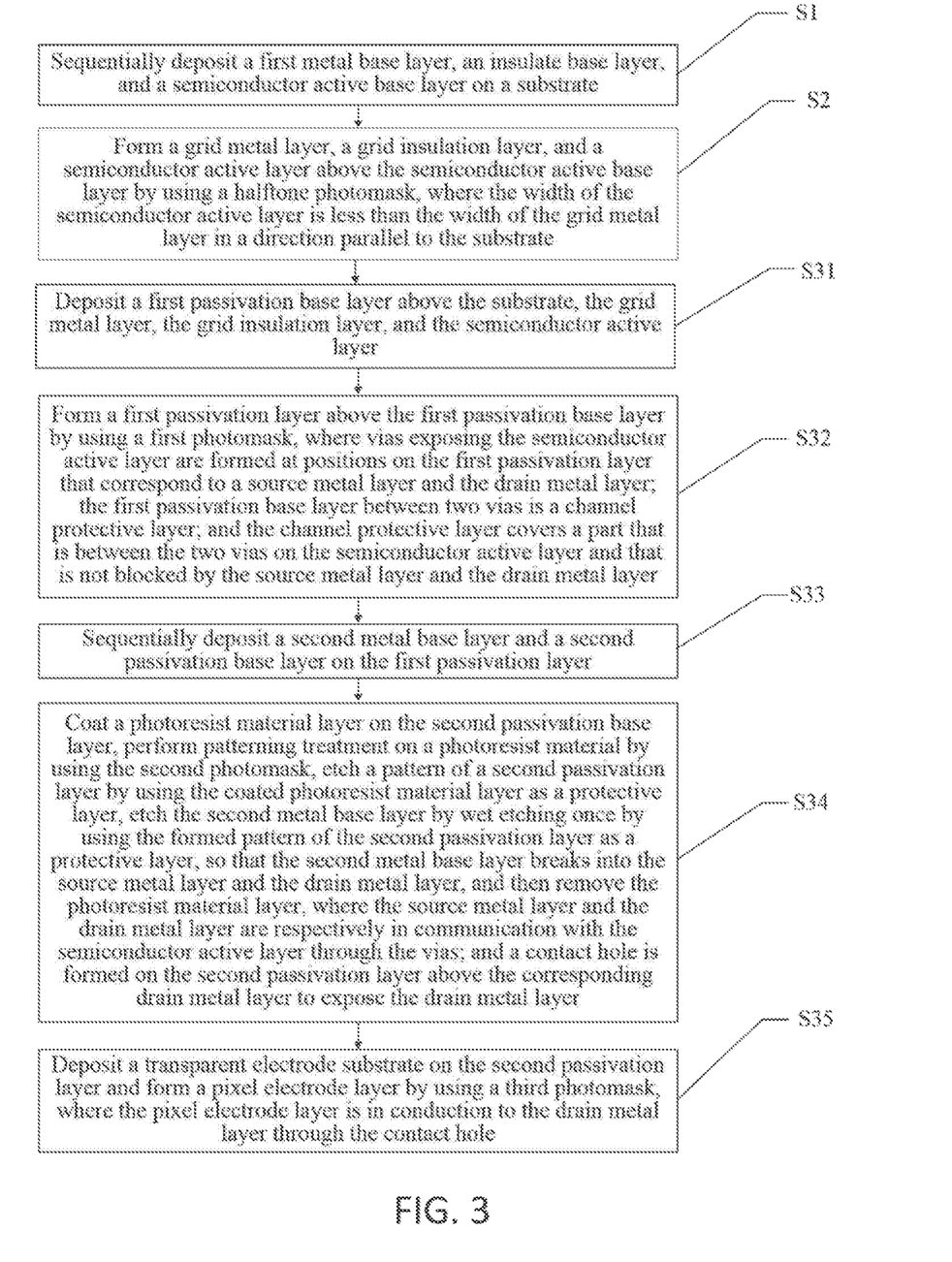
FIG. 3 is a flowchart of a method according to another embodiment of this application.
Figure 4A:
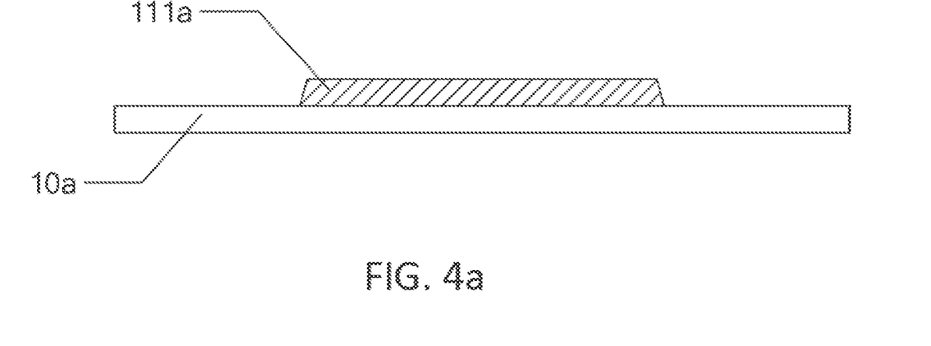
FIG. 4a to FIG. 4e are schematic sectional views of a manufacturing process by using a 4-mask process.
Figure 4B:
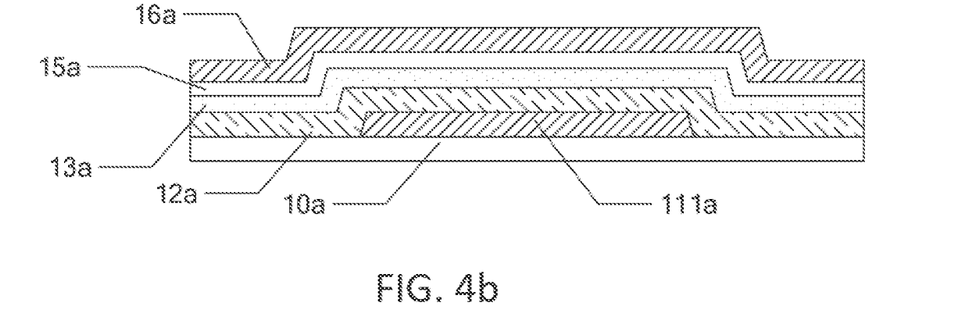
Figure 4C:
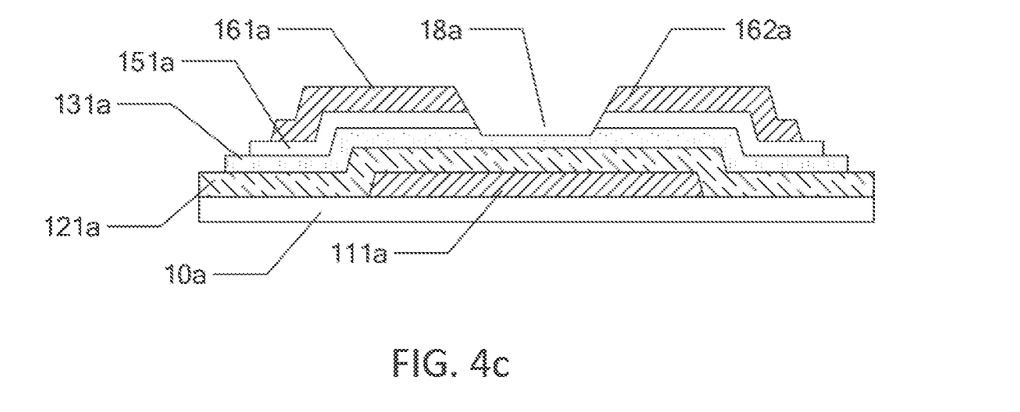
Figure 4D:
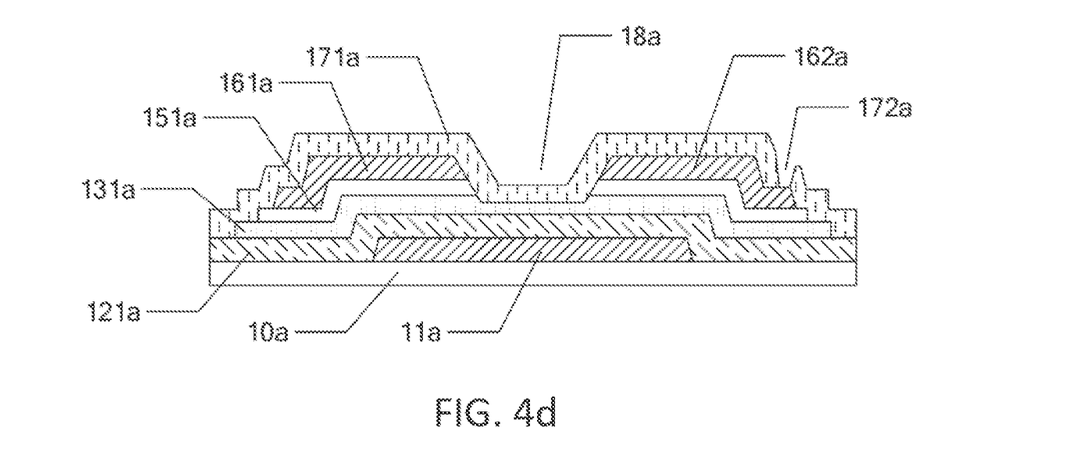
Figure 4E:
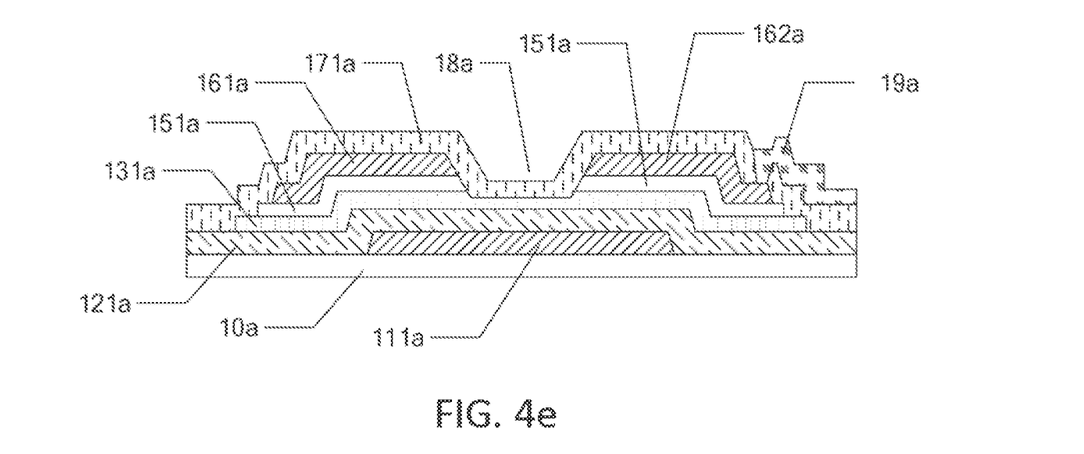

As shown in FIG. 3, in a possible method embodiment, the method is specifically:

S1. Referring to FIG. 1a, sequentially deposit a first metal base layer 11, an insulating base layer 12, and a semiconductor active base layer 13 on a substrate 10, where the first metal base layer 11 covers the substrate 10, the insulating base layer 12 covers the first metal base layer 11, and the semiconductor active base layer 13 covers the insulating base layer 12, so that the substrate 10, the first metal base layer 11, the insulating base layer 12, and the first metal base layer 11 form an integral panel structure.

Figure 1B:
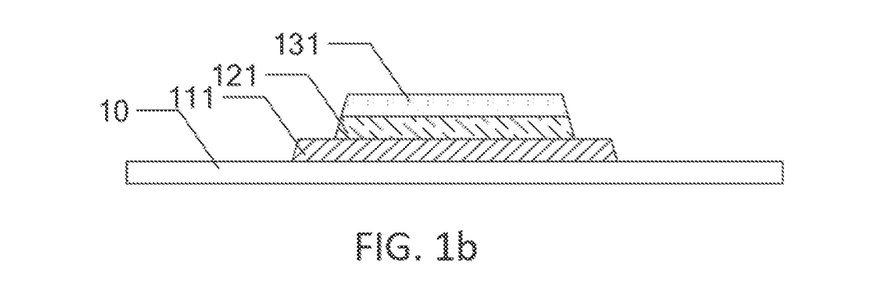

S2. Referring to FIG. 1b, perform exposure once above the semiconductor active base layer 13 by using a halftone photomask, where a gate metal layer 111, a gate insulating layer 121, and a semiconductor active layer 131 are formed above the semiconductor active base layer 13, the width of the semiconductor active layer 131 is less than the width of the gate metal layer 111 in a direction parallel to the substrate, and the width of the gate insulating layer 121 is also less than the width of the gate metal layer 111; and specifically, coat a photoresist material layer on the semiconductor active base layer 13, and perform patterning treatment on the photoresist material layer by using the halftone photomask, to obtain a pattern of the semiconductor active layer 131, a pattern of the gate insulating layer 121, and a pattern of the gate metal layer 111; then etch the first metal base layer 11, the insulating base layer 12, and the semiconductor active base layer 13, to sequentially obtain the gate metal layer 111, the gate insulating layer 121, and the semiconductor active layer 131; and remove the residual photoresist material layer. More specifically, the semiconductor active layer 131 is etched first, then the gate insulating layer 121 is etched, and finally the gate metal layer 111 is etched.

Figure 1C:
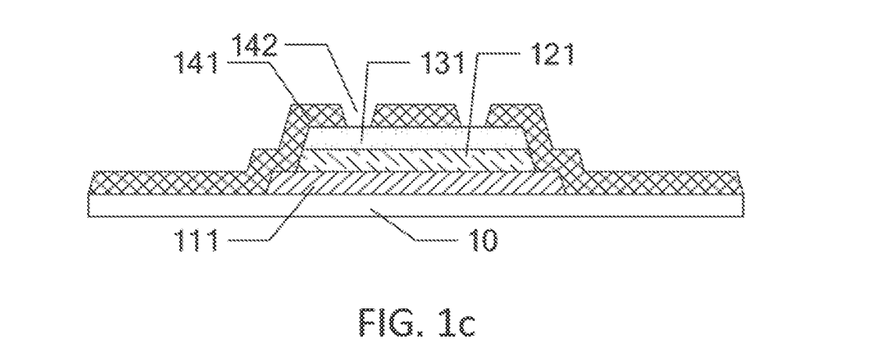

S31: Referring to FIG. 1c, deposit a first passivation base layer (not shown) above the substrate, the gate metal layer 111, the gate insulating layer 121, and the semiconductor active layer 131.

S32: Form a first passivation layer 141 above the first passivation base layer by using a first photomask, where via holes 142 exposing the semiconductor active layer 131 are formed at positions on the first passivation layer 141 corresponding to a source metal layer 161 and the drain metal layer 162; the first passivation base layer between two via holes 142 is a channel protective layer 18; and the channel protective layer 18 covers a part that is between the two via holes 142 on the semiconductor active layer 131 and that is not blocked by the source metal layer 161 and the drain metal layer 161; and specifically, coat a photoresist material layer on the first passivation base layer, perform patterning treatment on the photoresist material layer by using the first photomask to obtain a pattern of the first passivation layer 141, etch the first passivation layer 141 through dry etching to obtain the first passivation layer 141, and remove the residual photoresist material layer.

Figure 1D:
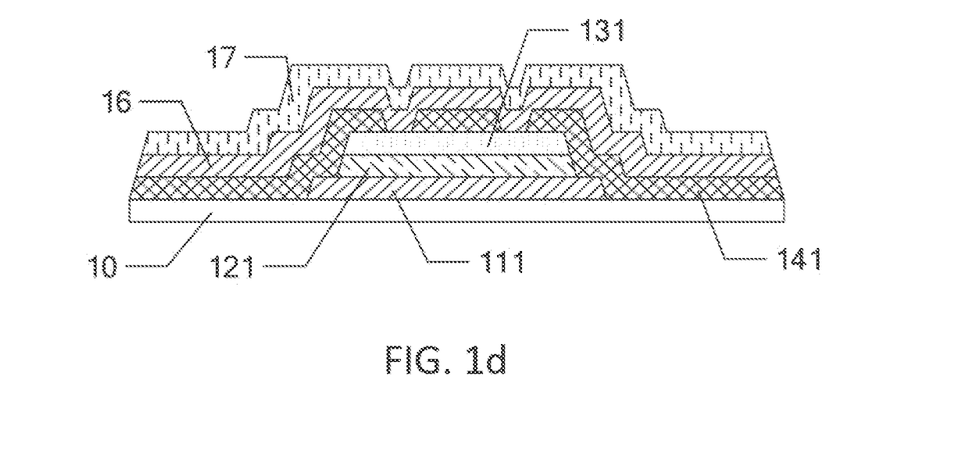

S33: Referring to FIG. 1d, sequentially deposit a second metal base layer 16 and a second passivation base layer 17 on the first passivation layer 141.

Figure 1E:
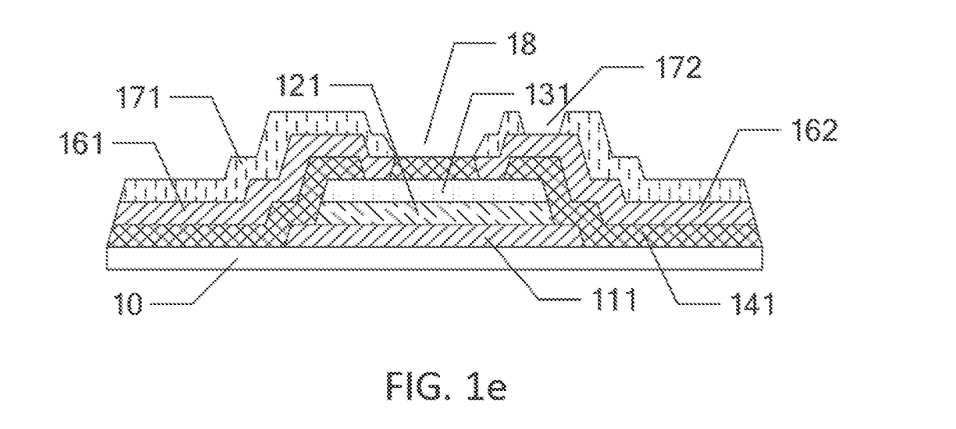

S34: Referring to FIG. 1e, coat a photoresist material layer on the second passivation base layer 17, perform patterning treatment on a photoresist material by using the second photomask, etch a pattern of a second passivation layer 171 by using the coated photoresist material layer as a protective layer, etch the second metal base layer 16 by wet etching once by using the formed pattern of the second passivation layer 171 as a protective layer, so that the second metal base layer 16 breaks into the source metal layer 161 and the drain metal layer 162, and then remove the photoresist material layer, where the source metal layer 161 and the drain metal layer 162 are respectively in communication with the semiconductor active layer 131 through the via holes 142; and a contact hole 172 is formed on the second passivation layer 171 above the corresponding drain metal layer 162 to expose the drain metal layer 162. In such a design, the second passivation layer 171, the source metal layer 161, and the drain metal layer 162 are manufactured through exposure development once, thereby saving a manufacturing process time.

Figure 1F:
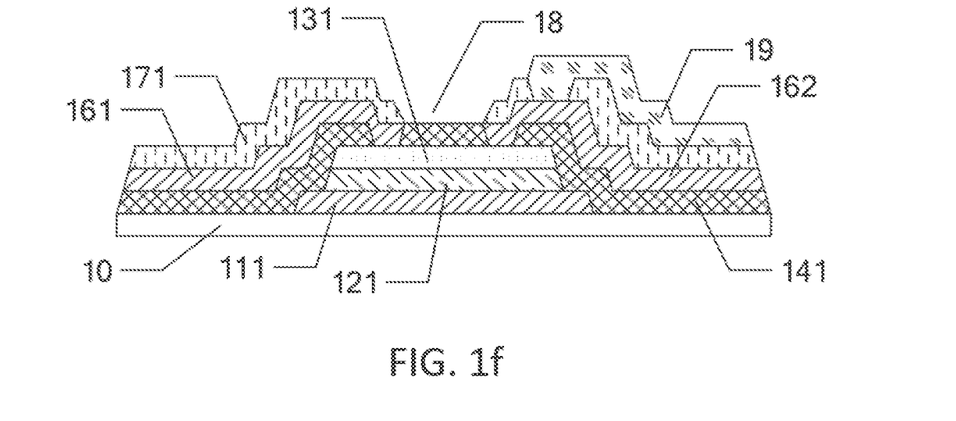

S35. Referring to FIG. 1*f*, deposit a transparent electrode substrate (TO) on the second passivation layer 171 and form a pixel electrode layer (ITO) by using a third photomask, where the pixel electrode layer 19 is in conduction to the drain metal layer 162 through the contact hole 172 to form a TFT switch.

Referring to FIG. 1*f*, this application further provides a display panel, and the display panel includes an array substrate and a second substrate disposed opposite to the array substrate; and the array substrate 10 includes:
a substrate;
a gate metal layer 111, the gate metal layer 111 being disposed on the substrate;
a gate insulating layer 121, the gate insulating layer 121 being disposed on the gate metal layer 111;
a semiconductor active layer 131, the semiconductor active layer 131 being disposed on the gate insulating layer 121; and
a source metal layer 161 and a drain metal layer 162, disposed on the semiconductor active layer 131, where the width of the semiconductor active layer 131 is less than the width of the gate metal layer 111 in a direction parallel to the substrate.

Specifically, the array substrate 10 includes:
a substrate;
a gate metal layer 111, the gate metal layer 111 being disposed on the substrate;
a gate insulating layer 121, the gate insulating layer 121 being disposed on the gate metal layer 111;
a semiconductor active layer 131, where the semiconductor active layer 131 is disposed on the gate insulating layer 121, and the width of the semiconductor active layer 131 is less than the width of the gate metal layer 111 in a direction parallel to the substrate;
a first passivation layer 141, where the first passivation layer 141 covers the gate metal layer 111, the gate insulating layer 121, and the semiconductor active layer 131, and two via holes 142 are formed on the first passivation layer 141 above the semiconductor active layer 131 to expose the semiconductor active layer 131;
a source metal layer 161 and a drain metal layer 162, disposed on the semiconductor active layer 131, where the source metal layer 161 covers one side of the first passivation layer 141, and one end of the source metal layer 161 is disposed in one via 142 and in contact with the semiconductor active layer 131;
the drain metal layer 162 covers the other side of the first passivation layer 141, and one end of the drain metal layer 162 is disposed in the other via 142 and in contact with the semiconductor active layer 131;
a channel protective layer 18 is disposed between the two via holes 142; and the channel protective layer 18 covers a part that is between the two via holes 142 on the semiconductor active layer 131 and that is not blocked by the source metal layer 161 and the drain metal layer 162;
a second passivation layer 171, disposed covering the source metal layer 161 and the drain metal layer 162 respectively, where a contact hole 172 is formed on the second passivation layer 171 above the corresponding drain metal layer 162 to expose the drain metal layer 162; and
a pixel electrode layer 19, disposed covering the second passivation layer 171 above the drain metal layer 162, where the pixel electrode layer 19 is in communication with the drain metal layer 162 through the contact hole 172.

Optionally, the width of the gate insulating layer 121 is less than the width of the gate metal layer 111, and the width of the semiconductor active layer 131 is less than the width of the gate insulating layer 121. In this way, the passivation layer fully covers the gate metal layer 111, the gate insulating layer 121, and the semiconductor active layer 131, and because the semiconductor active layer 131 has a relatively small width, the source metal layer 161 and the drain metal layer 162 blocks two ends of the semiconductor active layer 131.

Specifically, the width of the gate insulating layer 121 is also less than the width of the gate metal layer 111, and the width of the gate insulating layer 121 is the same as the width of the semiconductor active layer 131, so that the gate insulating layer 121 is in smooth transition to a side of the semiconductor active layer 131 to form a trapezoidal projection structure.

According to the array substrate of the display panel in this application, the gate metal layer 111, the gate insulating layer 121, and the semiconductor active layer 131 are formed by using one photomask process, the first passivation layer 141 is formed on the semiconductor active layer 131 by using one photomask process, and the source metal layer 161 and the drain metal layer 162 are formed on the first passivation layer 141. Therefore, compared with a 4-photomask process, in the 4-mask process, the pattern of the semiconductor active layer 131 is directly formed according to a photomask pattern instead of depending on patterns of other layers, so that a TFT of which the width of the semiconductor active layer 131 is less than the width of the gate metal layer 111 in the direction parallel to the substrate can also be made, the width of the semiconductor active layer 131 is reduced, and a doped silicon tail phenomenon is significantly improved, thereby alleviating a residual image impact and increasing endurance of the panel.

The channel protective layer 18 is formed on the part of the semiconductor active layer 131 and that is not blocked by the source metal layer and the drain metal layer 162, so that a TFT channel area is fully blocked by the source metal layer, the drain metal layer 162, and the channel protective layer 18, so that light in a panel does not radiate the semiconductor active layer 131 in the TFT channel area, thereby reducing generated photocurrents. According to the design of the manufacturing process, the surface of a channel area is first covered and protected by the first passivation base layer in a subsequent manufacturing process, and in the subsequent manufacturing process, the channel protective layer 18 formed by the first passivation base layer cuts off an impact of other materials on the channel area, back channel etching is not performed, and the interface status of the channel area is not deteriorated due to subsequent etching, thereby reducing electrical leakage of a TFT.

The gate insulating layer 121 is a silicon oxide film or a silicon nitride film.

The display panel of this application may be a twisted nematic (TN) panel, an in-plane switching (IPS) panel, or a vertical alignment (VA) panel, and may certainly be any other suitable type of panel.

The foregoing contents are detailed descriptions of this application in conjunction with specific implementations, and it should not be considered that the specific implementation of this application is limited to these descriptions. Persons of ordinary skill in the art can make simple deductions or replacements without departing from the concept of this application, and such deductions or replacements should all be considered as falling within the protection scope of this application.

What is claimed is:

1. A method for manufacturing an array substrate, the method comprising the following steps:

sequentially depositing a first metal base layer, an insulating base layer, and a semiconductor active base layer on a substrate;

forming a gate metal layer, a gate insulating layer, and a semiconductor active layer above the semiconductor active base layer by using one photomask process, wherein a width of the semiconductor active layer is less than a width of the gate metal layer in a direction parallel to the substrate;

forming a first passivation layer above the gate metal layer, the gate insulating layer, and the semiconductor active layer by using one photomask process, and forming a source metal layer and a drain metal layer on the first passivation layer; and forming a pixel electrode layer in conduction to the drain metal layer;

wherein the step of forming a first passivation layer above the gate metal layer, the gate insulating layer, and the semiconductor active layer by using one photomask process, and forming a source metal layer and a drain metal layer on the first passivation layer comprises the following steps;

depositing a first passivation base layer above the substrate, the gate metal layer, the gate insulating layer, and the semiconductor active layer;

forming a first passivation layer above the first passivation base layer by using a first photomask, wherein via holes exposing the semiconductor active layer are formed at positions on the first passivation layer that correspond to the source metal layer and the drain metal layer; the first passivation base layer between two via holes is a channel protective layer; and the channel protective layer covers a part that is between the two via holes on the semiconductor active layer and that is not blocked by the source metal layer and the drain metal layer;

sequentially depositing a second metal base layer and a second passivation base layer on the first passivation layer;

forming the source metal layer, the drain metal layer, and a second passivation layer above the second passivation base layer by using a second photomask, wherein the source metal layer and the drain metal layer are respectively in communication with the semiconductor active layer through the via holes; and a contact hole is formed on the second passivation layer above the corresponding drain metal layer to expose the drain metal layer; and the step of forming a pixel electrode layer in conduction to the drain metal layer comprises; depositing a transparent electrode substrate on the second passivation layer and forming the pixel electrode layer by using a third photomask, wherein the pixel electrode layer is in conduction to the drain metal layer through the contact hole;

wherein the step of forming the source metal layer, the drain metal layer, and a second passivation layer above the second passivation base layer by using a second photomask comprises; coating a photoresist material layer on the second passivation base layer, performing patterning treatment on a photoresist material by using the second photomask, etching a pattern of the second passivation layer by using the coated photoresist material layer as a protective layer, etching the second metal base layer by wet etching once by using the formed pattern of the second passivation layer as a protective layer, so that the second metal base layer breaks into the source metal layer and the drain metal layer, and then removing the photoresist material layer.

2. The method for manufacturing an array substrate according to claim 1, wherein in the step of forming a gate metal layer, a gate insulating layer, and a semiconductor active layer above the semiconductor active base layer by using one photomask process, exposure is performed once by using a halftone photomask, so that the gate metal layer, the gate insulating layer, and the semiconductor active layer are formed above the semiconductor active base layer, and the width of the semiconductor active layer is less than the width of the gate metal layer in the direction parallel to the substrate.

3. The method for manufacturing an array substrate according to claim 2, wherein in the step of performing exposure once by using a halftone photomask, an area that is of the halftone photomask and that is corresponding to the gate metal layer and not covered by the semiconductor active layer is a halftone area.

4. The method for manufacturing an array substrate according to claim 2, wherein the step of forming a gate metal layer, a gate insulating layer, and a semiconductor active layer above the semiconductor active base layer by using one photomask process comprises:

coating a photoresist material layer on the semiconductor active base layer, and performing patterning treatment on the photoresist material layer by using the halftone photomask, to obtain a pattern of the semiconductor active layer, a pattern of the gate insulating layer, and a pattern of the gate metal layer;

etching the first metal base layer, the insulating base layer, and the semiconductor active base layer, to sequentially obtain the gate metal layer, the gate insulating layer, and the semiconductor active layer; and removing the residual photoresist material layer.

5. The method for manufacturing an array substrate according to claim 1, wherein the step of forming a first passivation layer above the gate metal layer, the gate insulating layer, and the semiconductor active layer by using one photomask process, and forming a source metal layer and a drain metal layer on the first passivation layer further comprises a step of forming a channel protective layer on a part of the semiconductor active layer and that is not blocked by the source metal layer and the drain metal layer.

6. The method for manufacturing an array substrate according to claim 1, wherein the step of forming a first passivation layer above the first passivation base layer by using a first photomask comprises:

coating a photoresist material layer on the first passivation base layer, performing patterning treatment on the photoresist material layer by using the first photomask to obtain a pattern of the first passivation base layer, etching the first passivation layer through dry etching to obtain the first passivation layer, and removing the residual photoresist material layer.

* * * * *